Jan. 22, 1963

J. S. MURRAY 3,075,151

SELF-BIASED TRANSISTOR AMPLIFIERS HAVING AN EMITTER-FOLLOWER STAGE AND A SUBSEQUENT VOLTAGE AMPLIFYING STAGE

Filed May 26, 1958

2 Sheets-Sheet 1

Inventor
John Somerset Murray
by Malcolm W. Fraser
attorney

Inventor
John Somerset Murray
by Malcolm W. Fraser
attorney

United States Patent Office 3,075,151

Patented Jan. 22, 1963

3,075,151

SELF-BIASED TRANSISTOR AMPLIFIERS HAVING AN EMITTER-FOLLOWER STAGE AND A SUBSEQUENT VOLTAGE AMPLIFYING STAGE

John Somerset Murray, 144A Sloane St., London SW. 1, England

Filed May 26, 1958, Ser. No. 737,868
Claims priority, application Great Britain May 31, 1957
15 Claims. (Cl. 330—20)

This invention concerns improvements in and relating to self-biased transistor amplifiers having an emitter-follower stage and a subsequent voltage amplifying stage.

In my pending application Serial No. 691,839, there are described transistor amplifiers in which the base-collector bias voltage for a transistor comprised in a voltage-amplifying stage of an amplifier, this voltage amplifying-stage being the first stage of the amplifier, is provided by means of a direct-current, conductive bias loop which includes the base-emitter path of another transistor having its base connected for direct current to the collector of the transistor which is to be biassed. In that application, it is explained that the said other transistor either may be provided expressly for biasing purposes or may be the transistor which is in any case provided in a multistage amplifier.

However, if the first stage of a transistor amplifier is a current amplifying stage, in which the collector of the transistor included in the first stage is grounded (i.e. the stage is an emitter-follower stage), the said transistor, by virtue of the way in which it is connected in the stage, cannot have a bias which is determinable in the manner disclosed in the application above referred to; but a transistor which is included in a second, or more generally a subsequent stage, the said subsequent stage being a voltage-amplifying stage, does require to have its base-collector bias determined, and I have discovered that this can be achieved in a manner which is essentially similar to that disclosed in the application referred to.

As is well known, the input impedance to the base of a transistor which is connected in a voltage-amplifying stage is essentially not very high whereas the input impedance to the base of a transistor which is connected in a current-amplifying emitter-follower stage is much greater. Accordingly, if an amplifier is required to present at its first stage a high input impedance either to input signals to be amplified or to feedback signals or to both, that first stage must be a grounded-collector stage and only in the second, or more generally a subsequent, stage can voltage amplification be provided; and it is then the transistor in the voltage-amplifying subsequent stage whose base-collector bias must be determined.

It is an object of the present invention to provide means, in a transistor amplifier having an emitter-follower first stage and a voltage-amplifying subsequent stage, for determining the base-collector bias of the transistor included in the said subsequent stage.

It is a further object to eliminate from such an amplifier the interstage coupling components and wasteful D.C. biasing potentiometers which are inherent in the conventional biasing technique.

Figure 1:
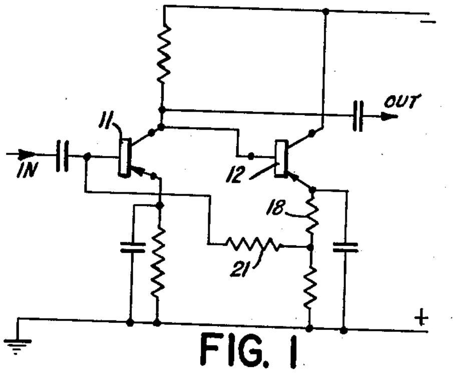
Figure 2:
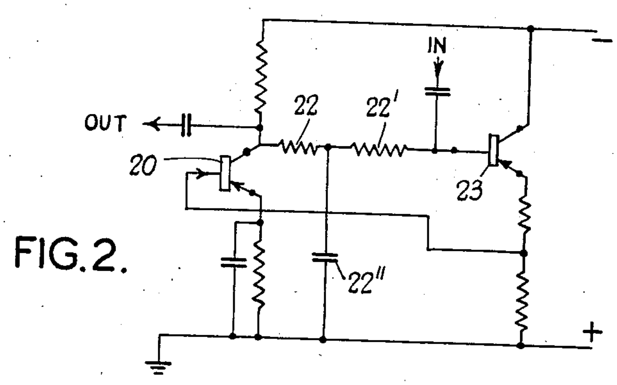

The invention will now be described with reference to the accompanying drawings in which:

FIGURE 1, which is included for comparison with FIGURE 2, shows the circuit of a single-stage transistor amplifier which embodies the invention disclosed in my pending application Serial No. 691,839, now Patent No. 2,959,741.

Figure 3:
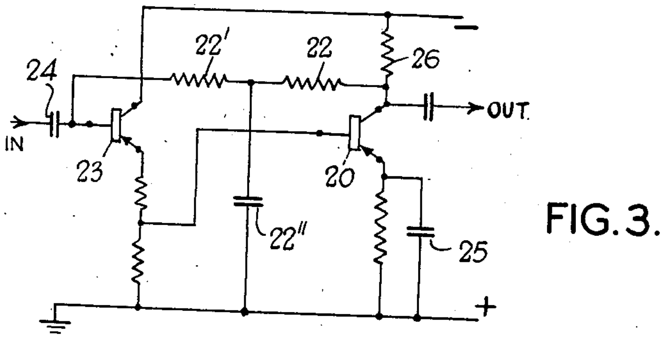

FIGURE 2 shows the same circuit as is shown in FIGURE 3, but is drawn differently for the purpose of comparison with FIGURE 1.

Figure 4A:
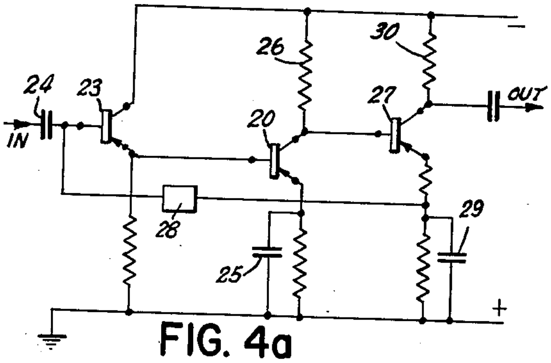
Figure 4:
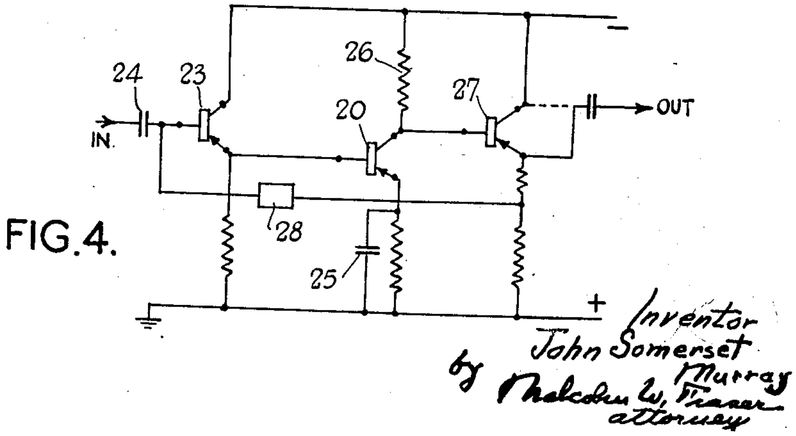
Figure 5:
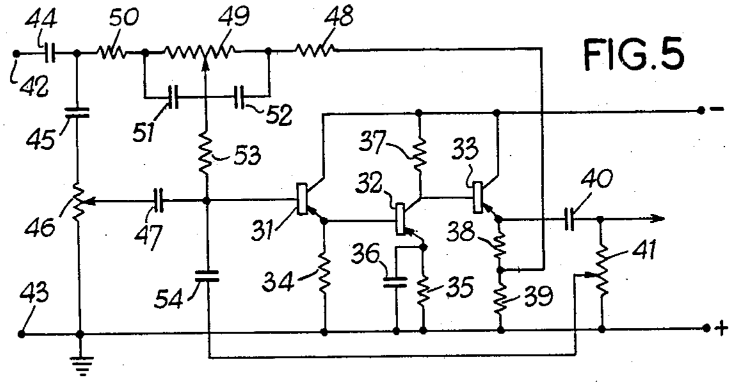
Figure 6:
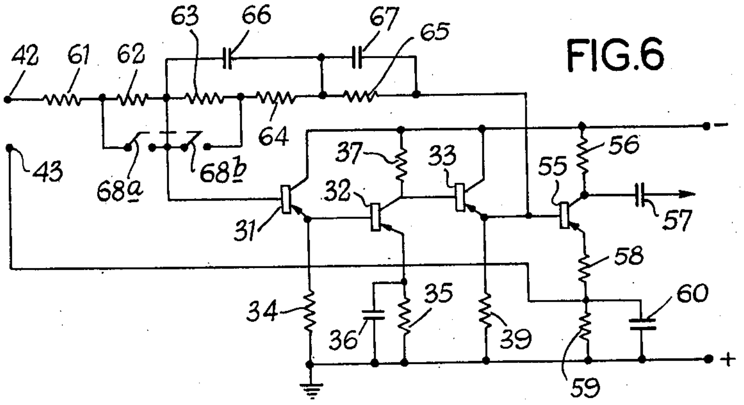
Figure 7:
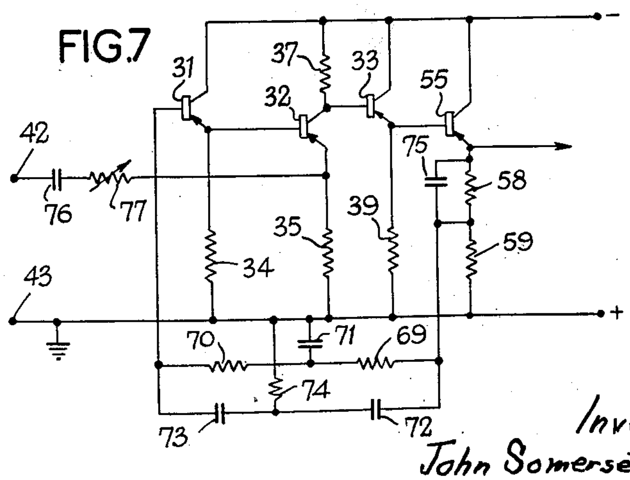

FIGURE 3 shows a two-stage phase-reversing transistor amplifier, according to the present invention, which has a high input impedance and a medium-high output impedance, FIGURE 4 shows a three-stage transistor amplifier according to the present invention, which has a high input impedance and a low output impedance and is suitable for use as an analogue-computer amplifier or a phase-reversing amplifier, FIGURE 4*a* shows the circuit of FIGURE 4 after modification of its output stage, FIGURE 5 shows a three-stage amplifier according to the invention, which is suitable for use as a tone control unit in a sound reproduction system, FIGURE 6 shows a four-stage amplifier according to the invention, for use as a gramophone pick-up pre-amplifier and embodying frequency-characteristic correction means for both short-play and long-play records, and FIGURE 7 shows a variable gain four-stage amplifier which includes a frequency-selective feedback network and constitutes an active filter.

As explained in detail in my pending application already referred to, the base-collector bias voltage of a transistor 11 comprised by the single voltage-amplifying stage of the amplifier shown in FIGURE 1 is determined by the sum of the base emitter potential drop of a transistor 12 (which is included in the amplifier only for the purpose of biasing the transistor 11) plus the sum of the potential drops across a resistor 18 and across a resistor 21 (carrying the base current of the transistor 11), which is always relatively small. Apart from the advantage, as compared with a conventionally biassed amplifying stage, that wide-tolerance components may be used in this circuit the transistor 11 base-collector bias determined in this manner is considerably less dependent on changes in collector leakage currents, due to temperature changes, than in previously known circuits.

The circuit shown in FIGURE 2 is in essence identical with that shown in FIGURE 1 insofar as D.C. conditions (i.e. the biasing conditions) are concerned, and has the same characteristics of wide tolerance of component values and insensitivity to temperature change. In FIGURE 1, the transistor 12 is provided merely for the purpose of biasing the transistor 11, the input signal being applied to the base, and the voltage-amplified output signal being taken from the collector, of the transistor 11. In FIGURE 2, the input signal is applied to the base of the transistor 23, which is equivalent to the transistor 12 in FIGURE 1, and after current-amplification is applied to the base of the transistor 20 (equivalent to the transistor 11 in FIGURE 1) from the collector of which the voltage-amplified output signal is taken. However, so far as the D.C. biasing conditions are concerned, the only difference between the two circuits is that, whereas in FIGURE 1 the base current (i.e. collector leakage current) flowing in the resistor 21 is that of the transistor 11, the base current (i.e. collector leakage current) flowing in the resistors 22 and 22' in FIGURE 2 is that of the transistor 23. Additionally a decoupling condenser 22'' is included in FIGURE 2 but this may be ignored in considering the D.C. conditions since it has no effect at zero frequency.

FIGURE 3 is exactly equivalent to FIGURE 2 but is drawn more conventionally, with the signal input point on the left, leading through an input condenser 24 to the base of the emitter-follower transistor 23, which thus constitutes a high-impedance signal-input point. The transistor 23 functions as a current-amplifier and feeds the current-amplified signal to the base of the transistor 20 which presents only medium input impedance of the order of 1000 ohms, since its emitter is decoupled by a condenser 25. The collector of the transistor 20 provides a voltage-amplified output-signal point of impedance slightly less than the impedance of the collector load 26.

The D.C. path (resistors 22 and 22') from the signal output point to the signal input point, which is required for biasing purposes, would, in the absence of decoupling, provide an A.C. signal feedback path which would reduce the input impedance of the amplifier. Decoupling is therefore provided by the condenser 22''.

It will be observed that, in the terminology used henceforth throughout this specification, the base-collector bias voltage for the transistor 20 is provided by means of a bias loop constituted by the resistor 22' and 22 in series, the base-emitter path of the transistor 23 and part of the emitter resistance for the transistor 23 this bias loop extending from the collector to the base of the transistor 20 and being conductive to direct current.

Amplifiers having the circuit shown in FIGURE 3 are effective as amplifiers of high input impedance working into a medium-high impedance load.

FIGURE 4 shows a transistor-amplifier which is adapted by the addition of a further emitter-follower stage, to provide a low impedance output. The first two stages, which include the transistors 23 and 20 are similar to those shown in FIGURE 3 so far as A.C. conditions are concerned, but the voltage-amplified output signal from the collector of the transistor 20 is applied to the base of a third transistor 27 which is connected as an emitter follower, the output signal of the amplifier being taken from the emitter of the transistor 27.

The base-collector bias loop for the transistor 20 is constituted in this case by the base-emitter paths of the two transistors 27 and 23, the upper part of the emitter resistance provided for the transistor 27 and an impedance 28 which may be resistive or complex but which in any case is conductive to D.C. and carries the base current of the transistor 23.

An important application of an amplifier having this circuit is in the case where signal feedback is employed to provide equalisation of the frequency characteristics of a transmission system or alternatively to integrate or to differentiate a waveform, as, for instance, in an analogue computer. Such an amplifier is particularly well adapted to circumstances in which the signal feedback loop from its output point to its input point is conductive to D.C. and can therefore itself constitute the impedance 28 in FIGURE 4. When this is the case the full advantages of the high input impedance to the base of the transistor 23 are realised, since there is no separate bias loop which might act as a shunt for the feedback signal which is applied to the base of the transistor 23.

If the amplifier shown in FIGURE 4 is required merely to amplify signals from a signal source which is conductive to D.C., the signal source itself may constitute the impedance 28 if the third stage of the amplifier is modified to give the circuit shown in FIGURE 4*a* by the addition of a decoupling condenser 29 in the emitter circuit and the inclusion of a collector load 30 in the collector lead, the output then being taken not from the emitter but from the collector of the transistor 27. It will be apparent that, as the signal input to the base of the transistor 23 is then applied by the bias loop itself, the input condenser 24 of FIGURE 4 and the separate input terminal to which it connects the base of the transistor 23 are no longer required; and accordingly this separate input means is omitted from the modified amplifier shown in FIGURE 4*a*.

It will be appreciated the circuit of either FIGURE 3 or FIGURE 4 may constitute one parallel half of a push-pull circuit of which the two halves are mirror images of one another, the complete push-pull circuit so obtained being adapted for D.C. amplification.

The three-stage circuit shown in FIGURE 5 is basically very similar to that shown in FIGURE 4, comprising as it does transistors 31, 32 and 33 which are included respectively in successive emitter-follower, grounded-emitter and emitter-follower stages. The circuit also comprises tone-control networks, and is equivalent in this respect to the Baxendall tone-control circuit which is well known in thermionic valve circuits.

The first-stage transistor 30 is provided with an emitter resistor 34, the second-stage transistor 31 is provided with an emitter resistor 35, decoupled by a condenser 36, and with a collector load resistor 37, and the third-stage transistor is provided with emitter resistance constituted by two resistors 38 and 39 in series. The bases of the transistors 32 and 33 are connected directly to the emitter of the transistor 31 and the collector of the transistor 32 respectively, so that signals applied to the base of the transistor 31 result in amplified output signals appearing at the emitter of the transistor 33, whence they are impressed, through an output condenser 40, across an output resistor 41.

Input terminals 42 and 43 are provided for signals to be amplified, the terminal 42 being connected to the base of the transistor 31 through an input condenser 44 and, in series therewith, a treble input network which comprises a condenser 45 and a variably-tapped resistance 46, of which the variable tapping is connected through a condenser 47 to the base of the transistor 31. Two feedback circuits are provided. The first which also constitutes the base input network, comprises, connected between the junction of the resistors 38 and 39 and the junction of the condensers 44 and 45, a chain constituted by a resistor 48, a variably-tapped resistor 49 and a resistor 50, the variable-tapping of the resistor 49 being connected to the ends of that resistor by condensers 51 and 52 and to the base of the transistor 31 by a resistor 53. The second feedback loop is taken from a variable tapping on the resistor 41 through a condenser 54 to the base of the transistor 31. Adjustment of the variably-tapped resistor 49 controls the frequency below which bass lift or bass drop of 6 dbs/octave is provided, and adjustment of the variably-tapped resistors 46 and 41 controls the two frequencies above which treble lift and, respectively, treble drop at 6 dbs/octave are provided, so that the frequency-response curve of the amplifier shows a 6 db/octave step up or down between two determinable frequencies and is flat above and below the step.

The bias loop, by which the D.C. base-collector bias for the transistor 32 is provided, is constituted by the base-emitter path of the transistor 33, the resistors 38, 48, 49 (part only) and 53 and the base-emitter path of the transistor 31. The bias loop is, accordingly, constituted entirely by components which are essential to the circuit for other purposes.

The condensers 47 and 54 are small and have negligible shunting effect, at low frequencies, on signals applied to the base of the transistor 31 from the terminal 42 through the resistors 50, 49 (part only) and 53. In order that they may be effective at high frequencies, the resistor 53 is made relatively large and isolates them at high frequencies from the low-frequency network which includes the resistor 49. The resistor 53, which is directly in series with the base of the transistor 31 for low-frequency components of the signal and feedback, is thus necessarily fairly large, and it will be seen that unless the input impedance at the base of the transistor 31 were many times greater again such low-frequency components would be appreciably attenuated. Since the transistor 32 in the voltage amplifying stage is required to give maximum gain, it cannot be made of high input impedance by means of emitter degeneration, and it would therefore be impracticable to apply the input and feedback signals directly to the base of the transistor 32. It is for this reason that the emitter-follower first-stage transistor 31 is inserted between the input and feedback signals and the transistor 32. It is, however, the voltage-amplifying transistor 32 whose base-collector bias needs to be accurately controlled and determined and thus arises the problem which is solved according to this invention, namely the biassing of a transistor comprised in a later stage than the first stage.

FIGURE 6 shows a circuit for a gramophone pre-amplifier unit, including frequency-characteristic correction means for short-play and long-play records. The circuit is largely similar to that shown in FIGURE 5, and similar components in the two figures are indicated by the same reference numerals, including the three transistors 31, 32, 33, their associated collector and emitter circuits and their interconnections with one another. These will not require description again.

The pre-amplifier shown in FIGURE 6 comprises also a fourth stage transistor 55, having its base connected directly to the emitter of the transistor 33. A collector load resistor 56 and output condenser 57 are provided, as well as emitter resistors 58 and 59 in series and a condenser 60 which decouples the resistor 59.

One input terminal, 43, is connected directly to the decoupled junction of the resistors 58 and 59, and the other input terminal is connected through resistors 61 and 62 in series to the base of the transistor 31, which is also connected to the emitter of the transistor 33 through a feedback network constituted by resistors 63, 64 and 65 in series, and condensers 66 and 67 which are connected in parallel with the resistors 63 and 64 and, respectively, 65. A ganged switch 68*a*, 68*b* is provided for shorting out the resistors 62 and 63. With the switch open and closed, respectively, the circuit provides for characteristic correction for short-play and long-play records.

The pre-amplifier shown in FIGURE 6 is intended for use with an inductive pick-up head which provides a D.C. path of fairly low resistance between its output terminals, and when such a pick-up, which requires to work into a high input impedance such as is provided by the emitter-follower transistor 31, is connected between the input terminals 42 and 43 it completes the base-collector bias loop for the voltage-amplifying transistor 32—this loop being constituted by the direct-current conductive connection between the emitter of the transistor 31 and the base of the transistor 32, the base-emitter path of the transistor 31, and the additional direct-current conductive means which is provided by the following circuit elements in series, namely the base-emitter paths of the transistors 33 and 38, the small resistor 58, the pick-up head connected between the terminals 42 and 43, the resistor 61, and the resistor 62, or the switch 68*a* if this is closed. As will be apparent from the foregoing, the said additional direct-current conductive means includes the signal source, being in this respect similar to the circuit shown in FIGURE 4*a*; but from the point of view of the amplifier as such (as distinct from the combination of amplifier and signal source) the said additional direct-current conductive means is interrupted to provide the two input terminals 42 and 43 for connection therebetween of a direct-current conductive signal source (not shown in FIGURE 6), one of the two terminals, 42, being connected through the resistor 61 and the resistor 62 or switch 68*a* to the base of the transistor 31 and the other of the two terminals, 43, being decoupled, by the condenser 60, for signal frequencies.

In the circuit shown in FIGURE 6, the emitter-follower first stage is provided in order that the feedback may be applied to a high input impedance, comparable with or greater than the impedance of the feedback network elements, since if it were applied directly to the base of the transistor 32 (with a relatively low input impedance, as explained above with reference to FIGURE 5) the feedback would be appreciably less. The resistors 61 and 62 are included to provide, in conjunction with the inductance of the signal source, the appropriate high-frequency de-emphasis since, as is well known, an amplifier provided with feedback in the manner shown operates on what is known as the "virtual earth" or "see-saw" principle in such manner that the input point (the base of the transistor 31) remains closely at earth potential due to the feedback, with the result that the inductance of the signal source and the resistors 61 and 62 control the high-frequency current component leaving the source such that above some appropriate frequency this current falls at approximately 6 dbs/octave.

The resistor 65 is made of large value, to prevent the amplification rising for frequencies below the bass burnover frequency (e.g. 50 c./s.) and thus overloading the amplifier with rumble. The transistor 55 is included to give additional gain and also to provide in its emitter circuit, and in the bias loop for the transistor 32, a point to which the input terminal 43 can be connected and which can be completely decoupled.

It will be seen that the point from which feedback is taken (the emitter of the transistor 33) is not at the same D.C. potential as the junction of the resistors 58 and 59, and therefore current will tend to flow between these two points through the inductive pick-up. Such current is, however, negligible due to the magnitude of the resistors 61, 62, 63, 64 and 65 in series, and, if desired, can be obviated entirely by connecting the resistor 65 not to the emitter of the transistor 33 but to the point on the emitter resistance 39 which is at the same D.C. potential as the function of the resistors 58 and 59.

FIGURE 7 shows an amplifier which constitutes an active filter for amplifying and passing a certain range of frequencies. Again it comprises first and third stages of which the transistors 31 and 33 are provided with emitter resistors 34 and 39 respectively and operate as emitter followers. Again the second stage includes the transistor 32 and the collector load resistor 37 and emitter resistor 35. Again, as in FIGURE 6, there is provided a fourth stage which includes the transistor 55, the fourth stage in this case, however, being connected as a further emitter-follower stage, the emitter of the transistor 55 being the signal output point and being provided with emitter resistors 58 and 59 in series. Feedback from the junction of the resistors 58 and 59 is again provided to the base of the transistor 31, in this case through a frequency-selective twin-T network which comprises resistors 69 and 70 in series, having their junction earthed through a condenser 71 and, in parallel with the resistors 69 and 70 in series, a pair of condensers 72 and 73 in series, having their junction earthed through a resistor 74. A feedback phase-advancing condenser 75 is also shown, in parallel with the resistor 58, but this condenser may be omitted if no phase-advance of the feedback signal is required.

In this circuit, the base-collector bias loop for the transistor 32 is constituted by the base-emitter paths of the transistors 33 and 55, the resistors 58, 69 and 70 in series, and the base-emitter path of the transistor 31. It will be appreciated that the component values of the twin-T network are determined by the desired frequency characteristic of the amplifier and that no useful purpose would be accomplished by specifying in this description any particular set of values for these components. It will be appreciated also that some other kind of feedback network may be used, in place of the twin-T network shown provided only that any such other network is conductive to direct current and is thereby adapted to form part of the base-collector bias loop for the transistor 32.

It will be seen that in the circuit shown in FIGURE 7, all four stages are operative so far as feedback is concerned and that the first stage, connected as an emitter-follower, provides the required high input impedance for the feedback signal.

The circuit is intended to be driven by a source of low output impedance, connected across the input terminals 42 and 43 of the circuit, and accordingly the terminal 42 is connected not to the transistor 31, but to the emitter of the transistor 32, through an input condenser 76 and a variable resistor 77 in series, the resistor 77 being of much smaller value than the emitter resistor 35. It will be observed that the feedback signal as applied to the base of the transistor 32, is negative relative to the input signal to the emitter of that transistor and accordingly at frequencies which are transmitted through the feedback network the overall gain of the amplifier is reduced proportionally. The voltage gain of the amplifier, for frequencies which are not eliminated by the feedback, is then determined by the adjustable ratio of the resistances of the resistors 37 and 77 respectively, and with no phase-reversal the output signal is taken from the emitter of the transistor 55 at a low output impedance as compared with the output impedance at the collector of the transistor 32. It may be noted that if only a moderately low output impedance is required of the amplifier, the transistor 33 and its emitter resistor 39 could be omitted, the collector of the transistor 32 being then connected directly to the base of the transistor 55.

It is instructive to compare the performance of an amplifier as shown in FIGURE 7 with that of a corresponding amplifier from which the first stage had been omitted, the feedback being then applied directly to the base of the transistor 32, and the fourth stage had also been omitted, the output and feedback signals being taken from the emitter of the transistor 33. Such a drastically modified amplifier would still be capable of providing a Q of about 6, which would be adequate for many filter purposes. For higher Q values, however, very high gain, to which the Q is proportional, must be extracted from the voltage-amplifying stage, requiring correspondingly high output impedance of that stage, and in that case the following emitter-follower stage or stages are necessary to reduce the impedance which feeds into the feedback network. Similarly, the input impedance to which the feedback is applied must be raised correspondingly, necessitating the inclusion of the emitter-follower stage as shown in FIGURE 7.

Components in particular satisfactory embodiments of amplifiers in accordance with FIGURES 5, 6 and 7 were as follows:

| | | Figure 5 | Figure 6 | Figure 7 |
|---|---|---|---|---|
| Transistors: | | | | |
| 31 | | XB 102 | XB 102 | XB 103 |
| 32 | | XB 103 | XB 103 | XB 103 |
| 33 | | XB 102 | XB 102 | XB 103 |
| 55 | | ------ | XB 103 | XB 103 |
| Resistors: | | | | |
| 34 | ohms | 4.7K | 22K | 22K |
| 35 | do | 5.6K | 15K | 15K |
| 37 | do | 3.3K | 27K | 27K |
| 38 | do | 560 | ------ | ------ |
| 39 | do | 4.7K | 10K | 10K |
| 41 | do | 2.0K | ------ | ------ |
| 46 | do | 2.0K | ------ | ------ |
| 48 | do | 680 | ------ | ------ |
| 49 | do | 10K | ------ | ------ |
| 50 | do | 1,350 | ------ | ------ |
| 53 | do | 3.9K | ------ | ------ |
| 56 | do | ------ | 1.5K | ------ |
| 58 | do | ------ | 100 | 100 |
| 59 | do | ------ | 1.5K | 1.5K |
| 61 | do | ------ | 3.9K | ------ |
| 62 | do | ------ | 2.7K | ------ |
| 63 | do | ------ | 5.6K | ------ |
| 64 | do | ------ | 12K | ------ |
| 65 | do | ------ | 120K | ------ |
| 77 | do | ------ | ------ | 50–500 |
| Condensers: | | | | |
| 36 | μf | 100 | 1,000 | ------ |
| 40 | μf | 100 | ------ | ------ |
| 44 | μf | 100 | ------ | ------ |
| 45 | μf | 100 | ------ | ------ |
| 47 | μf | .01 | ------ | ------ |
| 51 | μf | .25 | ------ | ------ |
| 52 | μf | .25 | ------ | ------ |
| 54 | μf | .01 | ------ | ------ |
| 60 | μf | ------ | 1,000 | ------ |
| 66 | pf | ------ | 200 | ------ |
| 67 | μf | ------ | .027 | ------ |

In each case, the operating voltage to be applied across the terminals indicated as + and — was 9 to 10 volts and in the case of FIGURE 6 the values given are for use with a pick-up head of inductance of 280 h. connected between the input terminals 42 and 43.

It will be appreciated that although all the transistors illustrated in the figures are of p-n-p type, the invention is equally applicable to amplifiers of which some or all of the transistors are of n-p-n type.

What I claim is:

1. A transistor amplifier comprising a pair of supply-voltage terminals for connection of a supply-voltage source therebetween, a current-amplifying emitter-follower stage including a first transistor, a subsequent voltage-amplifying stage including a second transistor, and at least one further stage each also including a respective transistor, the said current-amplifying emitter-follower stage further comprising signal input means to the first transistor and emitter resistance connecting the emitter of the first transistor to one of the said terminals, the collector of the first transistor being conductively connected to the other of the said terminals, the said subsequent stage including emitter resistance and collector resistance connecting the emitter and the collector of the second transistor to respective ones of the said two terminals, and each said further stage comprising emitter resistance connecting the emitter of the said respective transistor to one of the said terminals, the collector of each said respective transistor being conductively connected to the respective other one of the said terminals, at least each said further stage other than the last being an emitter-follower stage, wherein there is provided direct-current conductive means connecting the emitter of the said first transistor to the base of the said second transistor, and wherein there is further provided, connecting the collector of the said second transistor to the base of the said first transistor, additional direct-current conductive means which includes in series the base-emitter path of the said respective transistor of each said further stage both the said conductive means and the said additional conductive means excluding every interelectrode path other than transistor base-emitter paths of any semi-conductor device, whereby the said additional conductive means and the base-emitter path of the said first transistor and the said conductive means in series constitute a base-collector bias loop, extending from the collector to the base of the said second transistor, this loop being itself conductive for direct current and excluding every interelectrode path, other than transistor base-emitter paths, of any semi-conductor device.

2. An amplifier as claimed in claim 1, wherein the said subsequent stage follows the said emitter-follower stage directly, and the said conductive means is a direct connection, substantially without impedance, between the emitter of the said first transistor and the base of the said second transistor.

3. An amplifier as claimed in claim 1, wherein the said additional conductive means comprises two resistors in series and the junction of these two resistors is decoupled for signal frequencies.

4. An amplifier as claimed in claim 1, wherein the said emitter-follower stage, the said voltage-amplifying stage and the said last further stage are respectively the first, second and third stages of the amplifier, the third stage including a collector load resistor and the base of the said first transistor and the collector of the transistor included in the third stage being respectively connected to input and output terminals of the amplifier.

5. An amplifier as claimed in claim 1, wherein the said additional conductive means is interrupted to provide two input terminals for connection of a direct-current conductive signal source, one of these two terminals being connected to the base of the said first transistor and the other of the said terminals being decoupled for signal frequencies.

6. An amplifier as claimed in claim 5, wherein the said emitter-follower stage and the said subsequent voltage-amplifying stage are respectively the first and second stages of the amplifier and there are provided two said further stages constituting a third, emitter-follower stage and a fourth, voltage-amplifying stage of which the emitter circuit comprises two resistors in series, respectively connected directly to the emitter of the transistor included in the fourth stage and decoupled to earth, and wherein the said other input terminal is connected to the junction of the said two resistors.

7. An amplifier as claimed in claim 6, wherein the base of the first transistor is connected to the said one input terminal through two resistors in series, of which one is shunted by a first shorting switch, and to the emitter of the transistor included in the third stage through three resistors in series, two of these three resistors together being shunted by a first condenser and the third being shunted by a second condenser, and one of the two resistors which is shunted by the first condenser being also shunted by a second shorting switch which is ganged to the first shorting switch.

8. An amplifier as claimed in claim 1 wherein the last said further stage is also an emitter-follower stage.

9. An amplifier as claimed in claim 8, wherein the said emitter follower stage, the said voltage-amplifying stage and the said last further stage are respectively the first, second and third stages of the amplifier and the base of the said first transistor and the emitter of the transistor included in the third stage are respectively connected to input and output terminals of the amplifier.

10. An amplifier as claimed in claim 9, wherein the base of the said first transistor is connected to the said input terminal through a first resistance, one end of another resistance provided with a variable tapping connected to the said first resistance, a further resistance and an input condenser (all in series) and the variable tapping is connected through the other end of its resistance and a feedback resistance in series therewith to a point in the emitter circuit of the third stage, the said variable tapping being connected through two condensers to the junctions of its resistance with the said further resistance and the said feed-back resistance respectively.

11. An amplifier as claimed in claim 10, wherein the junction of the said input condenser and the said further resistance is connected to earth through a condenser and another variably-tapped resistance of which the variable tapping is connected through another condenser to the base of the first transistor.

12. An amplifier as claimed in claim 11, wherein the emitter of the transistor included in the third stage is connected to the said output terminal through an output condenser, and the output terminal is connected to earth through an additional variably-tapped resistance of which the variable tapping is connected through an additional condenser to the base of the first transistor.

13. An amplifier as claimed in claim 8, wherein the said current-amplifying emitter-follower stage and the said subsequent voltage-amplifying stage are respectively the first and second stages of the amplifier and there are provided two said further stages constituting emitter-follower third and fourth stages of the amplifier wherein the said first transistor is adapted to have feedback signals applied to its base in that the said bias loop includes, between the emitter circuit of the fourth stage and the base of the first transistor, a frequency-selective feedback network which applies feedback signals to the base of the first transistor and which is conductive to direct current, and wherein there is connected to the emitter of the second transistor, through a resistor, an input terminal for input signals from an external signal source.

14. An amplifier as claimed in claim 13, wherein the said feedback network is a twin-T network comprising two resistors in series having their junction connected to earth through a condenser and, in parallel with the said two resistors in series, two condensers in series having their junction connected to earth through a resistor.

15. An amplifier as claimed in claim 1, wherein the said additional conductive means is constituted in part by a signal feedback path of the amplifier.

References Cited in the file of this patent

UNITED STATES PATENTS

| | | |
|---|---|---|
| 2,761,917 | Aronson | Sept. 4, 1956 |
| 2,762,873 | Goodrich | Sept. 11, 1956 |
| 2,801,297 | Becking | July 30, 1957 |
| 2,847,519 | Aronson | Aug. 12, 1958 |
| 2,860,195 | Stanley | Nov. 11, 1958 |
| 2,863,957 | Hamilton | Dec. 9, 1958 |
| 2,887,542 | Blair | May 19, 1959 |

FOREIGN PATENTS

| | | |
|---|---|---|
| 526,970 | Belgium | Mar. 31, 1954 |

OTHER REFERENCES

McKinley et al.: "Transistor Amplifier for Medical Recording," Electronics, Aug. 1, 1957, pages 161–163.

Murray: "Transistor Bias Stabilization," Electronic and Radio Engineer, May 1957, pages 161–165.